United States Patent
Wang

(10) Patent No.: US 11,068,009 B2
(45) Date of Patent: Jul. 20, 2021

(54) REGULATOR CIRCUIT AND MANUFACTURE THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Jun Wang, Shanghai (CN)

(73) Assignees: SEMICONDUCTOR MANUFACTURING INTERNATIONAL (SHANGHAI) CORPORATION; SEMICONDUCTOR MANUFACTURING INTERNATIONAL (BEIJING) CORPORATION

( * ) Notice: Subject to any disclaimer, the term of this patent is extended or adjusted under 35 U.S.C. 154(b) by 0 days.

(21) Appl. No.: 16/044,949

(22) Filed: Jul. 25, 2018

(65) Prior Publication Data

US 2019/0033906 A1    Jan. 31, 2019

(30) Foreign Application Priority Data

Jul. 26, 2017  (CN) .......................... 201710615534.9

(51) Int. Cl.
G05F 3/26     (2006.01)
G05F 3/24     (2006.01)
H03F 1/02     (2006.01)

(52) U.S. Cl.
CPC .............. *G05F 3/262* (2013.01); *G05F 3/242* (2013.01); *H03F 1/0216* (2013.01)

(58) Field of Classification Search
CPC .................................. G05F 3/262; G05F 3/24
See application file for complete search history.

(56) References Cited

U.S. PATENT DOCUMENTS 5,945,821 A * 8/1999 Sakurai ................... G05F 3/247
                                                    323/313
6,087,821 A * 7/2000 Kojima ................... G05F 3/262
                                                    323/315

(Continued)

FOREIGN PATENT DOCUMENTS

CN    103592989 A    2/2014
CN    104216455 B    12/2014

*Primary Examiner* — Thienvu V Tran
*Assistant Examiner* — Bart Iliya
(74) *Attorney, Agent, or Firm* — Innovation Counsel LLP

(57) ABSTRACT

A regulator circuit and its manufacturing method are presented, relating to semiconductor technology. The regulator circuit comprises a mirror current source comprising two current output nodes; a depletion MOS transistor comprising a drain connected to one current output node of the mirror current source, a gate connected to the ground, and a source; an enhancement MOS transistor comprising a drain connected to the other current output node of the mirror current source, and a source connected to the ground; a first resistance device comprising a first node connected to the drain of the depletion MOS transistor, and a second node connected to a gate of the enhancement MOS transistor; and a second resistance device comprising a first node connected to the first resistance device, and a second node connected to the ground. This regulator circuit consumes less power than its conventional counterparts.

12 Claims, 3 Drawing Sheets

(56) References Cited

U.S. PATENT DOCUMENTS

| | | | | |
|---|---|---|---|---|
| 7,248,025 B2* | 7/2007 | Adachi | ............... | G05F 1/575 |
| | | | | 323/273 |
| 8,212,545 B2* | 7/2012 | Imura | ............... | G05F 3/24 |
| | | | | 323/313 |
| 2003/0197552 A1* | 10/2003 | Watanabe | ............... | G05F 3/245 |
| | | | | 327/541 |
| 2003/0205993 A1* | 11/2003 | Andoh | ............... | G05F 3/245 |
| | | | | 323/312 |
| 2007/0013431 A1* | 1/2007 | Owen | ............... | G11C 7/062 |
| | | | | 327/333 |
| 2012/0092064 A1* | 4/2012 | Floyd | ............... | G05F 3/242 |
| | | | | 327/543 |
| 2016/0147245 A1* | 5/2016 | Kundu | ............... | G05F 3/262 |
| | | | | 327/361 |
| 2017/0115679 A1* | 4/2017 | Watanabe | ............... | G05F 1/575 |

* cited by examiner

REGULATOR CIRCUIT AND MANUFACTURE THEREOF

CROSS-REFERENCE TO RELATED APPLICATION

This application claims priority to and benefit of Chinese Patent Application No. 201710615534.9 filed on Jul. 26, 2017, which is incorporated herein by reference in its entirety.

BACKGROUND

(a) Field of the Invention

This inventive concept relates to semiconductor technology and, more specifically, to a regulator circuit and its manufacturing method.

(b) Description of the Related Art

Circuit modular with ultra low power consumption, such as nano-watt voltage reference and operational amplifier, are playing an increasingly important role in wearable devices and Internet-of-Thing (IoT) technology. Low Dropout Regulator (LDR) can provide accurate, low noise power supply for individual circuit modular in System-on-a-Chip (SoC), therefore it has become a basic power module in SoC and has been widely adopted in various low-power applications. One major challenge, however, is to lower the power consumption of a LDR. Conventionally, this is achieved by lowering the power consumption of a feedback control circuit in a LDR.

However, since a LDR comprises a voltage reference circuit and a feedback control circuit, reducing the power consumption on just a feedback control circuit has limited effect on overall power consumption of a LDR. Based on the investigation on the limitations of conventional circuits, this inventive concept proposes a solution that remedies at least one limitation in conventional circuits.

SUMMARY

This inventive concept first presents a regulator circuit, comprising:

a mirror current source comprising two current output nodes;

a depletion Metal-Oxide-Semiconductor (MOS) transistor comprising a drain connected to one current output node of the mirror current source, a gate connected to the ground, and a source;

an enhancement MOS transistor comprising a drain connected to the other current output node of the mirror current source, and a source connected to the ground;

a first resistance device comprising a first node connected to the drain of the depletion MOS transistor, and a second node connected to a gate of the enhancement MOS transistor; and a second resistance device comprising a first node connected to the first resistance device, and a second node connected to the ground.

Additionally, the aforementioned circuit may further comprise an amplifier comprising a first node connected to a power source, a second node connected to the drain of the depletion MOS transistor, and a third node connected to the first node of the first resistance device.

Additionally, the aforementioned circuit may further comprise:

a regulator comprising a source connected to a power source, a gate connected to the drain of the depletion MOS transistor, and a drain connected to the first node of the first resistance device; and a capacitance device comprising a first node connected to the gate of the regulator, and a second node connected to the source of the regulator.

Additionally, in the aforementioned circuit, the mirror current source may comprise two MOS transistors, with gates of these two MOS transistors connected to each other, sources of these two MOS transistors connected to a power source, and a drain of one of the MOS transistors connected to its gate.

This inventive concept further presents a manufacturing method of a regulator circuit, comprising:

connecting a first current output node of a mirror current source to a drain of a depletion Metal-Oxide-Semiconductor (MOS) transistor;

connecting a second current output node of the mirror current source to a drain of an enhancement MOS transistor;

connecting a gate and a source of the depletion MOS transistor to the ground;

connecting a source of the enhancement MOS transistor to the ground;

connecting a first node of a first resistance device to the drain of the depletion MOS transistor;

connecting a second node of the first resistance device to a gate of the enhancement MOS transistor;

connecting a first node of a second resistance device to the first resistance device; and connecting a second node of the second resistance device to the ground.

Additionally, the aforementioned method may further comprise:

connecting a first node of an amplifier to a power source;

connecting a second node of the amplifier to the drain of the depletion MOS transistor; and connecting a third node of the amplifier to the first node of the first resistance device.

Additionally, the aforementioned method may further comprise:

connecting a source of a regulator to a power source;

connecting a gate of the regulator to the drain of the depletion MOS transistor;

connecting a drain of the regulator to the first node of the first resistance device;

connecting a first node of a capacitance device to the gate of the regulator; and connecting a second node of the capacitance device to the source of the regulator.

Additionally, the aforementioned method may further comprise:

forming a mirror current source comprising two MOS transistors, wherein gates of these two MOS transistors are connected to each other, sources of these two MOS transistors are connected to a power source, and a drain of one of these MOS transistors is connected to its gate.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
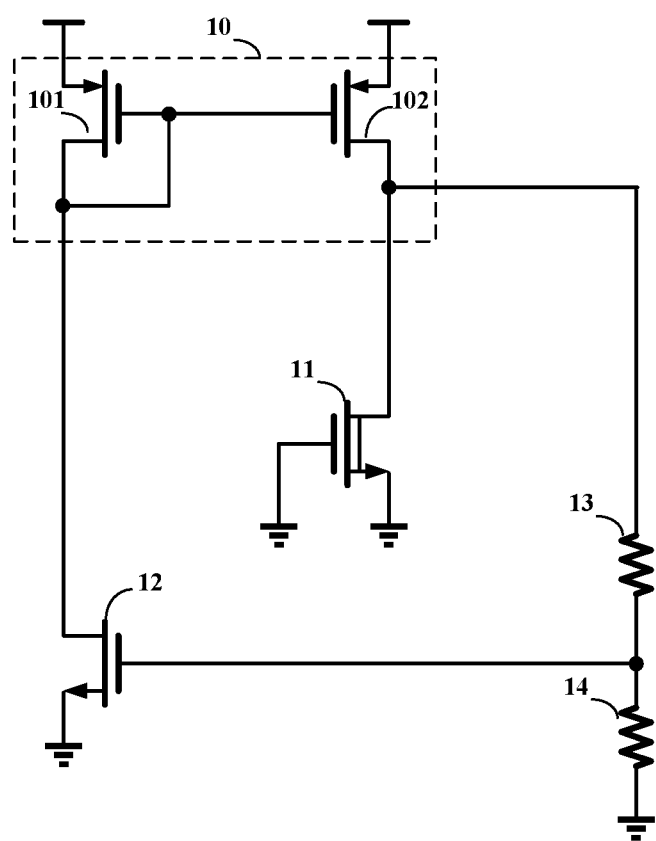
FIG. 1 shows a diagram illustrating a regulator circuit in accordance with one embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a diagram illustrating a regulator circuit in accordance with one embodiment of this inventive concept. Referring to FIG. 1, this regulator circuit may comprise a mirror current source 10, a depletion Metal-Oxide-Semiconductor (MOS) transistor 11, an enhancement MOS transistor 12, a first resistance device 13, and a second resistance device 14.

The mirror current source 10 provides two mirror output currents: one going through the depletion MOS transistor 11, and the other going through the enhancement MOS transistor 12. The depletion MOS transistor 11 may comprise a drain connected to one current output node of the mirror current source 10, and a gate and a source both connected to the ground. The depletion MOS transistor 11 may be manufactured from a native MOS transistor and the manufacturing process does not required addition hard masks. The enhancement MOS transistor 12 may have its drain connected to the other current output node of the mirror current source 10, and its source connected to the ground. The first resistance device 13 may have its first node connected to the drain of the depletion MOS transistor 11, and its second node connected to a gate of the enhancement MOS transistor 12 to provide it a voltage supply. The second resistance device 14 may have its first node connected to the first resistance device 13, and its second node connected to the ground, so that it can work as a voltage-dividing resistance.

Referring to FIG. 1, in one embodiment, the mirror current source may comprise a first enhancement source MOS transistor 101 and a second enhancement source MOS transistor 102, with gates of these two source MOS transistors connected to each other, sources of these two source MOS transistors connected to a power source, and a drain of the first enhancement source MOS transistor 101 connected to its gate, so that the currents going through two current output nodes of the mirror current source have the same magnitude and direction.

In this embodiment, since the break-over current of a depletion MOS transistor has an opposite sign to that of an enhancement MOS transistor, this regulator circuit, by incorporating a depletion MOS transistor and an enhancement MOS transistor, can achieve a good temperature stability on its output voltage without resorting to a voltage reference circuit, thus the overall power consumption of the circuit may be substantially reduced.

Figure 2:
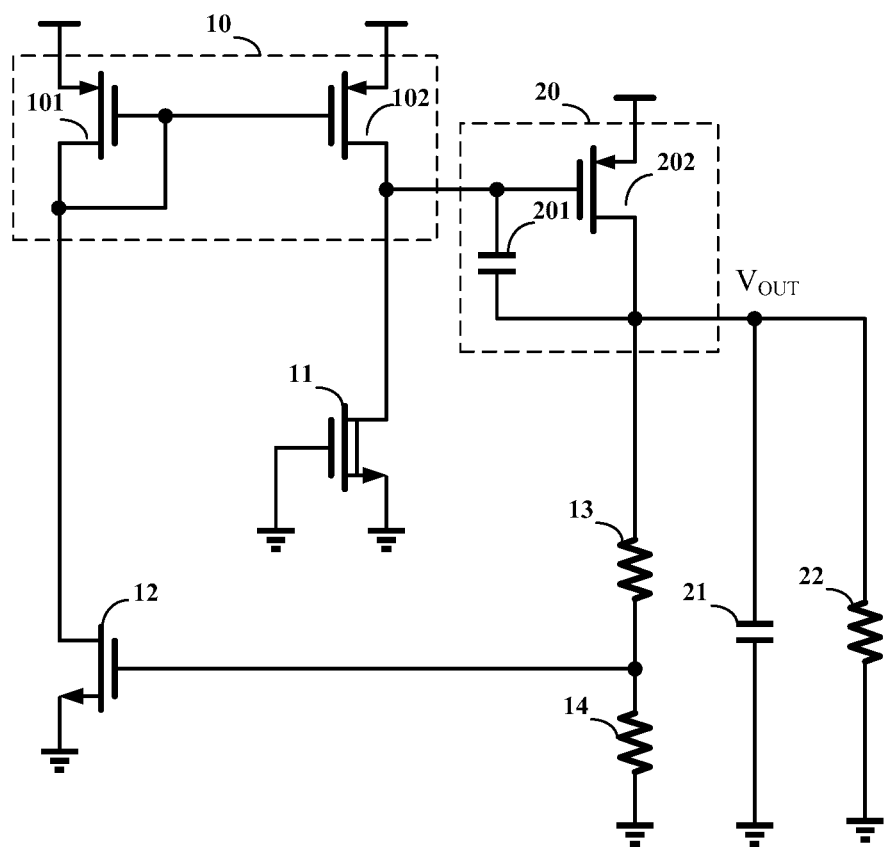
FIG. 2 shows a diagram illustrating a regulator circuit in accordance with a second embodiment of this inventive concept.

FIG. 2 shows a diagram illustrating a regulator circuit in accordance with a second embodiment of this inventive concept.

Referring to FIG. 2, this regulator circuit, in addition to the components shown in FIG. 1, may further comprise an amplifier 20. The amplifier 20 may have its first node connected to a power source, its second node connected to the drain of the depletion MOS transistor 11, and its third node connected to the first node of the first resistance device 13.

In one embodiment, the amplifier 20 may comprise a capacitance device 201 and a regulator 202, with a source of the regulator 202 connected to the power source, a gate of the regulator 202 connected to the drain of the depletion MOS transistor 11, and a drain of the regulator 202 connected to the first node of the first resistance device 13, and a first node and a second node of the capacitance device 201 connected to the gate and the drain of the regulator 202, respectively. The regulator 202 may play a role of an adjustable resistance in this regulator circuit.

Additionally, as shown in FIG. 2, another capacitance device 21 and another resistance device 22 may be placed between the first node of the first resistance device 13 and the ground, so that an output voltage $V_{out}$ of the regulator circuit may be measured.

In this embodiment, the currents going through the depletion MOS transistor 11 and the enhancement MOS transistor 12 have the same magnitude and sign, thus these two MOS transistors are equivalent to a voltage reference circuit embedded in a feedback control circuit, and this circuit can achieve a good temperature stability on its output voltage. Since this circuit does not include any actual voltage reference component, its power consumption is substantially lower than that of its conventional counterparts.

Figure 3:
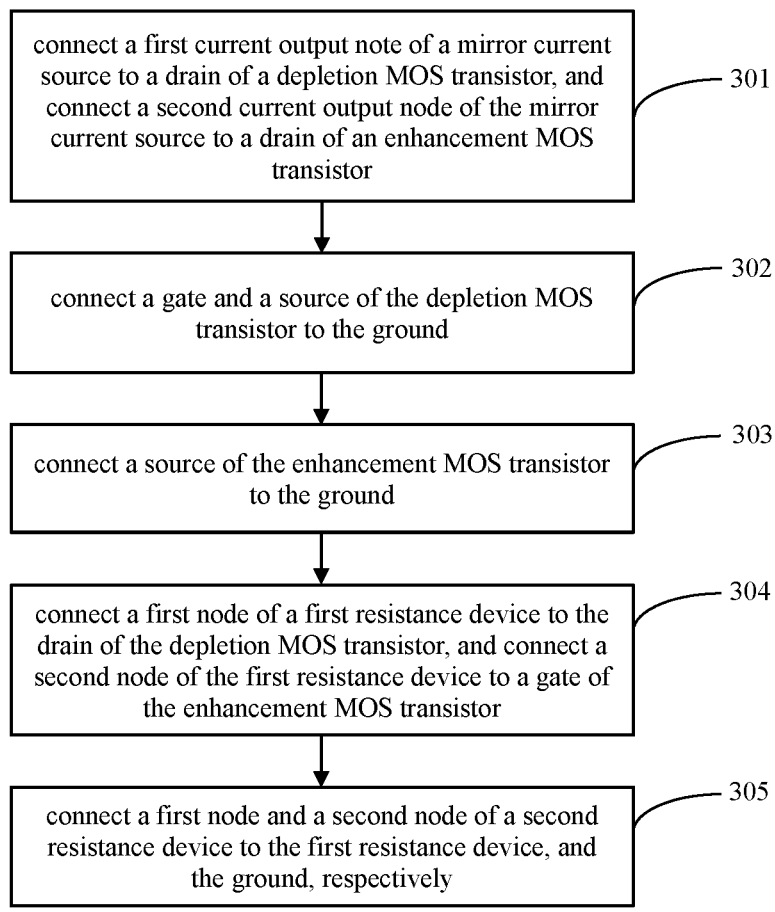
FIG. 3 shows a flowchart illustrating a manufacturing method of a regulator circuit in accordance with one embodiment of this inventive concept.

FIG. 3 shows a flowchart illustrating a manufacturing method of a regulator circuit in accordance with one embodiment of this inventive concept.

Referring to FIG. 3, this manufacturing method comprises steps 301 to 305. In step 301, a first current output node and a second current output node of a mirror current source are connected to a drain of a depletion MOS transistor and a drain of an enhancement MOS transistor, respectively.

In one embodiment, the mirror current source may comprise two source MOS transistors, with gates of these two source MOS transistors connected to each other, sources of these two source MOS transistors connected to a power source, and a drain of one of these two source MOS transistors connected to its gate.

In step 302, a source and a gate of the depletion MOS transistor are connected to the ground.

In step 303, a source of the enhancement MOS transistor is connected to the ground.

In step 304, a first node and a second node of a first resistance device are connected to the drain of the depletion MOS transistor, and a gate of the enhancement MOS transistor, respectively.

In step 305, a first node and a second node of a second resistance device are connected to a first resistance device and the ground, respectively.

In one embodiment, the method may further comprise: connecting a first node of an amplifier to a power source, connecting a second node of the amplifier to the drain of the depletion MOS transistor, and connecting a third node of the amplifier to the first node of the first resistance device.

In another embodiment, the method may further comprise: connecting a source of a regulator to the power source, connecting a gate of the regulator to the drain of the depletion MOS transistor, connecting a drain of the regulator to the first node of the first resistance device, and connecting a first node and a second node of the capacitance device to the gate and the drain of the regulator, respectively.

In the embodiment described above, since the break-over current of a depletion MOS transistor has an opposite sign to that of an enhancement MOS transistor, this regulator circuit, by incorporating a depletion MOS transistor and an enhancement MOS transistor, can achieve a good temperature stability on its output voltage without resorting to a voltage reference circuit, thus the overall power consumption of the circuit may be substantially reduced.

This concludes the description of a regulator circuit and its manufacturing methods in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A regulator circuit, comprising:
a mirror current source comprising two current output nodes;
a depletion Metal-Oxide-Semiconductor (MOS) transistor comprising a drain connected to a first current output node of the mirror current source, a gate connected to the ground, and a source;
an enhancement MOS transistor comprising a drain connected to a second current output node of the mirror current source, and a source connected to the ground;
a first capacitance device;
a first resistance device comprising a first node electrically connected through the first capacitance device and no transistor to the drain of the depletion MOS transistor, and a second node connected to a gate of the enhancement MOS transistor, wherein the gate of the enhancement MOS transistor is electrically connected through no transistor to the first resistance device and is electrically connected through the first resistance device and through no transistor to the drain of the depletion MOS transistor; and
a second resistance device comprising a first node connected to the first resistance device, and a second node connected to the ground.

2. The circuit of claim 1, further comprising:
an amplifier comprising a first node connected to a power source, a second node connected to the drain of the depletion MOS transistor, and a third node connected to the first node of the first resistance device.

3. The circuit of claim 1, further comprising:
a regulator comprising a source connected to a power source, a gate connected to the drain of the depletion MOS transistor, and a drain connected to the first node of the first resistance device, wherein the first
capacitance device comprises a first node directly connected to the gate of the regulator and comprises a second node directly connected to the drain of the regulator.

4. The circuit of claim 1, wherein the mirror current source comprises:
two MOS transistors, with gates of these two MOS transistors connected to each other, sources of these two MOS transistors directly connected to a power source, and a drain of one of the MOS transistors directly connected to its gate.

5. The circuit of claim 1, further comprising: a second capacitance device electrically connected through the first capacitance device and no transistor to the drain of the depletion MOS transistor.

6. The circuit of claim 5, further comprising: a third resistance device electrically connected through the first capacitance device and no transistor to the drain of the depletion MOS transistor.

7. A manufacturing method of a regulator circuit, comprising:
connecting a first current output node of a mirror current source to a drain of a depletion Metal-Oxide-Semiconductor (MOS) transistor;
connecting a second current output node of the mirror current source to a drain of an enhancement MOS transistor;
connecting a gate and a source of the depletion MOS transistor to the ground;
connecting a source of the enhancement MOS transistor to the ground;
providing a first capacitance device;
electrically connecting a first node of a first resistance device through the first capacitance device and no transistor to the drain of the depletion MOS transistor;
connecting a second node of the first resistance device to a gate of the enhancement MOS transistor, wherein the gate of the enhancement MOS transistor is electrically connected through no transistor to the first resistance device and is electrically connected through the first resistance device and through no transistor to the drain of the depletion MOS transistor;
connecting a first node of a second resistance device to the first resistance device; and
connecting a second node of the second resistance device to the ground.

8. The method of claim 7, further comprising:
connecting a first node of an amplifier to a power source;
connecting a second node of the amplifier to the drain of the depletion MOS transistor; and
connecting a third node of the amplifier to the first node of the first resistance device.

9. The method of claim 7, further comprising:
connecting a source of a regulator to a power source;
connecting a gate of the regulator to the drain of the depletion MOS transistor;
connecting a drain of the regulator to the first node of the first resistance device;
directly connecting a first node of the first capacitance device to the gate of the regulator; and
directly connecting a second node of the first capacitance device to the drain of the regulator.

10. The method of claim 7, further comprising:
forming a mirror current source comprising two MOS transistors, wherein gates of these two MOS transistors are connected to each other, sources of these two MOS transistors are directly connected to a power source, and a drain of one of these MOS transistors is directly connected to its gate.

11. The method of claim 7, further comprising: electrically connecting a second capacitance device through the first capacitance device and no transistor to the drain of the depletion MOS transistor.

12. The method of claim 11, further comprising: electrically connecting a third resistance device through the first capacitance device and no transistor to the drain of the depletion MOS transistor.

* * * * *